(12) United States Patent
Zhao

(10) Patent No.: US 12,114,477 B2
(45) Date of Patent: Oct. 8, 2024

(54) SEMICONDUCTOR DEVICE AND METHOD FOR FORMING THE SAME

(71) Applicant: CHANGXIN MEMORY TECHNOLOGIES, INC., Hefei (CN)

(72) Inventor: Liang Zhao, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 529 days.

(21) Appl. No.: 17/386,017

(22) Filed: Jul. 27, 2021

(65) Prior Publication Data

US 2022/0059538 A1 Feb. 24, 2022

Related U.S. Application Data

(63) Continuation of application No. PCT/CN2021/079626, filed on Mar. 9, 2021.

(30) Foreign Application Priority Data

Aug. 21, 2020 (CN) .......................... 202010848067.6

(51) Int. Cl.
*H10B 12/00* (2023.01)

(52) U.S. Cl.
CPC .......... *H10B 12/30* (2023.02); *H10B 12/033* (2023.02)

(58) Field of Classification Search
CPC .............................. H10B 12/30; H10B 12/033
See application file for complete search history.

(56) References Cited

U.S. PATENT DOCUMENTS

| 6,653,155 B2 | 11/2003 | Won |
| 6,844,610 B2 | 1/2005 | Won |
| 7,387,939 B2 | 6/2008 | Manning |
| 7,585,741 B2 | 9/2009 | Manning |
| 7,915,136 B2 | 3/2011 | Manning |

(Continued)

FOREIGN PATENT DOCUMENTS

| CN | 102074483 A | 5/2011 |
| CN | 102655151 A | 9/2012 |

(Continued)

OTHER PUBLICATIONS

International Search Report in the international application No. PCT/CN2021/097506, mailed on Sep. 1, 2021.

(Continued)

*Primary Examiner* — Tucker J Wright
(74) *Attorney, Agent, or Firm* — Syncoda LLC; Feng Ma

(57) ABSTRACT

A semiconductor device includes: a substrate, including a memory array region and a peripheral region; a first interlayer insulation layer and the second interlayer insulation layer which are formed on the substrate in the memory array region and the peripheral region, the first interlayer insulation layer and the second interlayer insulation layer being arranged at intervals along a direction perpendicular to the substrate; a columnar capacitor array, including columnar capacitors arranged at intervals, and the columnar capacitors being formed in the first interlayer insulation layer and the second interlayer insulation layer in the memory array region; and a contact structure, formed in the first interlayer insulation layer and the second interlayer insulation layer in the peripheral region.

17 Claims, 16 Drawing Sheets

(56) References Cited

U.S. PATENT DOCUMENTS

| | | |
|---|---|---|
| 8,043,923 B2 | 10/2011 | Kim |
| 8,164,132 B2 | 4/2012 | Manning |
| 8,946,800 B2 | 2/2015 | Kume |
| 10,840,248 B2 | 11/2020 | Nagai |
| 2002/0137273 A1 | 9/2002 | Won |
| 2004/0056755 A1 | 3/2004 | Won |
| 2006/0014344 A1 | 1/2006 | Manning |
| 2006/0249798 A1 | 11/2006 | Manning |
| 2009/0078981 A1 | 3/2009 | Yokoi |
| 2009/0286377 A1 | 11/2009 | Manning |
| 2010/0327410 A1 | 12/2010 | Park |
| 2011/0124173 A1 | 5/2011 | Kim |
| 2011/0165756 A1 | 7/2011 | Satoru |
| 2011/0186964 A1 | 8/2011 | Manning |
| 2012/0193760 A1 | 8/2012 | Manabe |
| 2013/0168812 A1 | 7/2013 | Lee |
| 2013/0285203 A1* | 10/2013 | Hiroi .................. H01L 28/40 257/532 |
| 2015/0056778 A1 | 2/2015 | Manabe et al. |
| 2017/0025416 A1 | 1/2017 | Han et al. |
| 2018/0122810 A1 | 5/2018 | Han et al. |
| 2019/0237469 A1 | 8/2019 | Nagai |

FOREIGN PATENT DOCUMENTS

| | | |
|---|---|---|
| CN | 110085574 A | 8/2019 |
| CN | 110970436 A | 4/2020 |
| CN | 111463205 A | 7/2020 |
| JP | 2000196038 A | 7/2000 |

OTHER PUBLICATIONS

International Search Report in the international application No. PCT/CN2021/079626, mailed on Jun. 8, 2021.

Supplementary European Search Report in the European application No. 21773267.6, mailed on May 23, 2022.

Second Office Action of the European application No. 21773267.6, issued on Oct. 4, 2023. 6 pages.

* cited by examiner

SEMICONDUCTOR DEVICE AND METHOD FOR FORMING THE SAME

CROSS-REFERENCE TO RELATED APPLICATIONS

This is a continuation of International Patent Application No. PCT/CN2021/079626 filed on Mar. 9, 2021, which claims priority to Chinese Patent Application No. 202010848067.6 filed on Aug. 21, 2020. The disclosures of these applications are hereby incorporated by reference in their entirety.

BACKGROUND

With the ongoing development of mobile devices, the mobile devices with a battery power supply, such as a mobile phone, a tablet computer, a wearable device, and the like, are increasingly used. A memory device is an indispensable element in the mobile device. Demands on small size and integration of the memory are huge.

At present, a Dynamic Random-Access Memory (DRAM) is widely used in the mobile devices because of its fast transmission speed.

SUMMARY

The disclosure relates to a semiconductor device and a method for forming the same.

Embodiments of the present application provide a semiconductor device, including: a substrate, a first interlayer insulation layer, a second interlayer insulation layer, a columnar capacitor array, and a contact structure.

The substrate includes a memory array region and a peripheral region.

The first interlayer insulation layer and the second interlayer insulation layer are formed in the memory array region and the peripheral region of the substrate, and the first interlayer insulation layer and the second interlayer insulation layer are arranged at intervals along a direction perpendicular to the substrate.

The columnar capacitor array includes columnar capacitors arranged at intervals, and the columnar capacitors are formed in the first interlayer insulation layer and the second interlayer insulation layer within the memory array region.

The contact structure is formed in the first interlayer insulation layer and the second interlayer insulation layer within the peripheral region.

A method for forming a semiconductor device includes the following operations.

A substrate is provided. The substrate includes a memory array region and a peripheral region.

A first interlayer insulation layer and a second interlayer insulation layer are formed on the substrate, and the first interlayer insulation layer and the second interlayer insulation layer are arranged at intervals along a direction perpendicular to the substrate.

A contact structure is formed in the first interlayer insulation layer and the second interlayer insulation layer in the peripheral region.

A columnar capacitor array is formed in the first interlayer insulation layer and the second interlayer insulation layer in the memory array region. The columnar capacitor array includes columnar capacitors arranged at intervals. The details of one or more embodiments of the present disclosure are set forth in the accompanying drawings and description below. Other features and advantages of the present disclosure will be apparent from the specification, drawings, and claims.

BRIEF DESCRIPTION OF THE DRAWINGS

In order to describe technical solutions in the embodiments of the present disclosure more clearly, the drawings used in the embodiments will be simply introduced below. Apparently, the drawings in the following description are only some embodiments of the present application. Those of ordinary skill in the art may further obtain other drawings according to these drawings without creative work.

Figure 1:
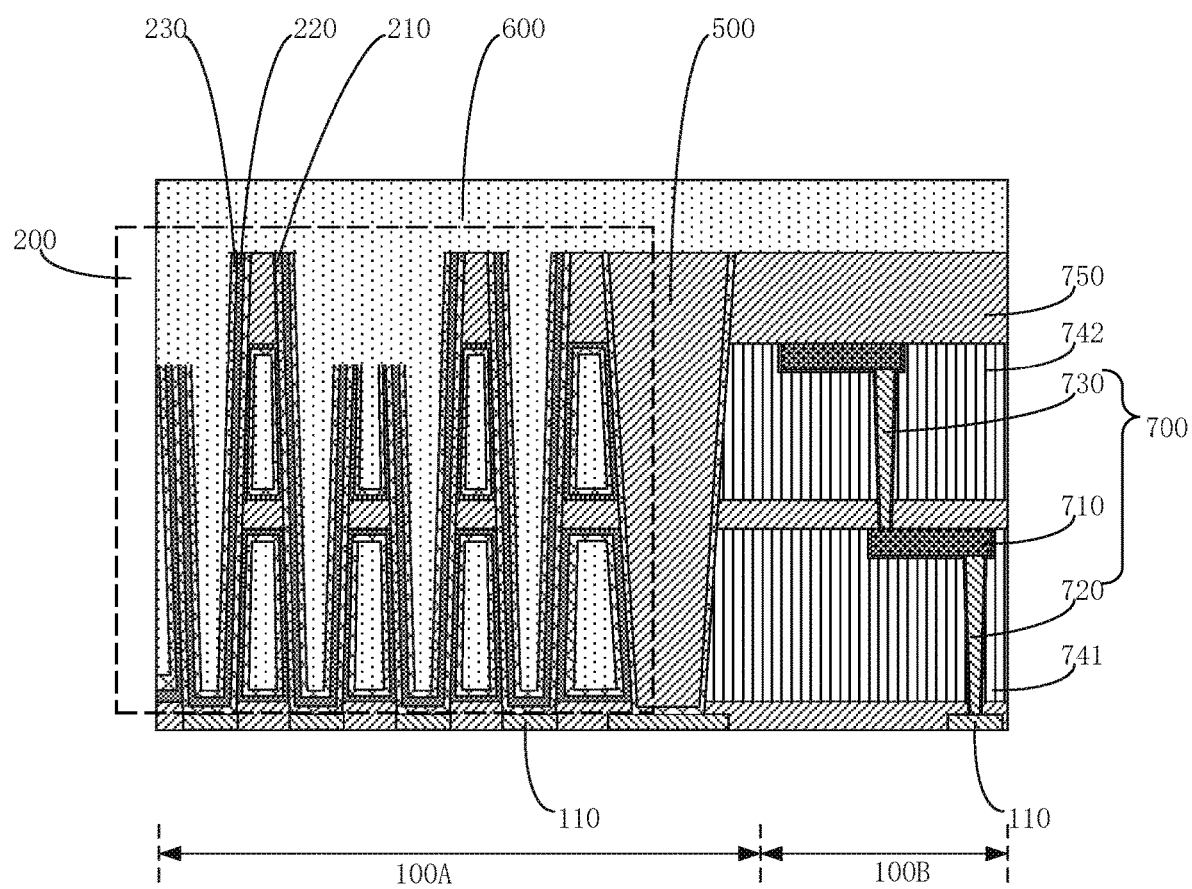
FIG. 1 is a schematic cross-sectional view of a semiconductor device of an embodiment.

The description of element numerals is as follows.

Memory array region: 100A; peripheral region: 100B; contact node: 110; first mask layer: 120; second mask layer: 130; third mask layer: 140; fourth mask layer: 150; columnar capacitor array: 200; first electrode layer: 210; second trench: 211; capacitor dielectric layer: 220; second electrode layer: 230; peripheral structure: 500; first trench: 510; electrode filling layer: 600; contact structure: 700; intermediate metal layer: 710; first contact structure: 720; first contact structure trench: 721; contact metal layer: 722; second contact structure: 730; first interlayer insulation layer: 741; second interlayer insulation layer: 742; supporting layer:

750; third interlayer insulation layer: 760; third contact structure: 800; fourth contact structure: 900.

DETAILED DESCRIPTION

With the continuous miniaturization of the volume of the dynamic random-access memory, the size of a columnar capacitor in a dynamic random-access memory is also reduced. The density of existing device structures and wiring modes are relatively low, which cannot meet the demand for the density of integration.

To facilitate an understanding of the disclosure, the disclosure will be described below in detail with reference to the accompanying drawings. Some embodiments of the disclosure are illustrated in the accompanying drawings. However, the disclosure may be embodied in many different forms and should not be construed as limited to the embodiments set forth herein. Rather, these embodiments are provided so that the disclosure will be thorough and complete.

Unless defined otherwise, all technical and scientific terms used herein have the same meaning as commonly understood by those of ordinary skill in the art to which the disclosure belongs. The terms used herein in the specification of the disclosure are for the purpose of describing specific embodiments only and are not intended to be limiting of the disclosure. As used herein, the term "and/or" includes any and all combinations of one or more of the associated listed items.

In the description of the disclosure, it is to be understood that the terms "upper", "lower", "vertical", "horizontal", "inner", "outer", and the like refer to orientations or location relationships based on methods or location relationships shown in the drawings, are merely intended to facilitate the description of the disclosure and to simplify the description, and are not intended to indicate or imply that a device or element referred to must have a specific orientation or be configured and operated in a specific orientation, so that the terms are not to be construed as limiting the disclosure.

FIG. 1 is a schematic cross-sectional view of a semiconductor device of an embodiment. Referring to FIG. 1, in the embodiment, the semiconductor device includes a substrate (not shown), a first interlayer insulation layer 741, a second interlayer insulation layer 742, a columnar capacitor array 200, and a contact structure 700.

In particular, the substrate includes a memory array region 100A and a peripheral region 100B. Material of the substrate may be monocrystalline silicon, polysilicon, silicon-on-insulator (SOI), and the like, or other material known to those skilled in the art. Further, the memory array region 100A and the peripheral region 100B may be isolated by a shallow trench isolation structure (not shown) in the substrate to prevent phenomena such as a leakage current, and the like, thereby improving the reliability of the semiconductor device.

The first interlayer insulation layer 741 and the second interlayer insulation layer 742 are formed in the memory array region 100A and the peripheral region 100B of the substrate, and the first interlayer insulation layer 741 and the second interlayer insulation layer 742 are arranged at intervals along a direction parallel to the substrate. In particular, material of the first interlayer insulation layer 741 and the second interlayer insulation layer 742 may be a low-K dielectric, which refers to dielectric material having a dielectric constant less than or almost equal to 4, and may be, for example, silicon oxide, and the like.

Further, a supporting layer 750 may be formed on a surface of the first interlayer insulation layer 741 and/or a surface of the second interlayer insulation layer 742. The supporting layer 750 extends in a direction parallel to the direction of the surface of the substrate to provide support for the first interlayer insulation layer 741 and the second interlayer insulation layer 742. Thickness of the first interlayer insulation layer 741 and thickness of the second interlayer insulation layer 742 defines height of the subsequently-formed supporting layer 750. Therefore, the thickness of the first interlayer insulation layer 741 and the thickness of the second interlayer insulation layer 742 may be adjusted according to height location of the supporting layer 750 needing to be formed.

The columnar capacitor array 200 includes columnar capacitors arranged at intervals, and the columnar capacitors are formed in the first interlayer insulation layer 741 and the second interlayer insulation layer 742 within the memory array region 100A. The columnar capacitor array 200 is configured to store data to realize a data storage function of a memory.

The contact structure 700 is formed in the first interlayer insulation layer 741 and the second interlayer insulation layer 742 within the peripheral region 100B. The first interlayer insulation layer 741 and the second interlayer insulation layer 742 extend to cover the entire surface of the peripheral region 100B, thereby completely covering the contact structure 700.

In the embodiment, through arrangement of the contact structure 700 in the first interlayer insulation layer 741 and the second interlayer insulation layer 742, a connection path of the contact structure 700 may be effectively shortened, space of the columnar capacitor array 200 is effectively utilized, arrangement density of each structure in the semiconductor device is improved, and integration level of the semiconductor device is improved.

In an embodiment, the contact structure 700 includes a first contact structure 720 and a second contact structure 730 which are interconnected. The first contact structure 720 or the second contact structure 730 is interconnected by penetrating the first interlayer insulation layer 741 or the second interlayer insulation layer 742. Illustratively, material of the first contact structure 720 and material of the second contact structure 730 may be conductive metal material such as tungsten. The material of the first contact structure 720 and the material of the second contact structure 730 may be the same or different.

Further, an intermediate metal layer 710 may also be formed on a side of the first interlayer insulation layer 741 away from the substrate, and the surface of the intermediate metal layer 710 is flush with the surface of the first interlayer insulation layer 741. The intermediate metal layer 710 and the contact structure 700 are sequentially and alternately arranged in a direction perpendicular to the substrate, that is, the first contact structure 720, the intermediate metal layer 710, the second contact structure 730, and another intermediate metal layer 710 are sequentially arranged in the direction perpendicular to the substrate. The first contact structure 720 and the second contact structure 730 are interconnected via the intermediate metal layer 710. The first contact structure 720 penetrates the first interlayer insulation layer 741 for an upward connection to the intermediate metal layer 710, and the second contact structure 730 penetrates the second interlayer insulation layer 742 and the supporting layer 750 for a downward connection to the same intermediate metal layer 710, thereby realizing the interconnection of the first contact structure 720 and the second contact structure 730.

In the embodiment, through arrangement of the intermediate metal layer 710, not only lengths of the first contact structure 720 and the second contact structure 730 in the contact structure 700 may be effectively shortened to reduce an overall resistance value of the contact structure 700, but also the contact structure 700 may be enabled to have a certain length in a plane parallel to the substrate, thereby shortening the length of the connection path of the memory array region 100A and the peripheral region 100B in the horizontal plane.

It is to be noted that, in other embodiments, three or more interlayer insulation layers may be arranged, and the supporting layer 750 is formed between every two adjacent interlayer insulation layers so as to fit the columnar capacitor structures with the relatively high aspect ratio and provide the higher supporting ability, thereby preventing structure damage of the columnar capacitors and further improving structure stability of the semiconductor device. When a plurality of supporting layers 750 are arranged, the plurality of supporting layers 750 may be arranged equidistantly in the vertical direction, thereby ensuring that a first electrode layer 210 is uniformly stressed.

Still further, thickness of the plurality of supporting layers 750 may be different. Illustratively, the supporting layers 750 on the top and at the bottom may be made thicker, and the supporting layer 750 in the middle may be made thinner. Moreover, material of each supporting layer 750 may be the same, such as silicon oxide or silicon nitride. The material of each supporting layer 750 may also be different, for example, the material of one supporting layer 750 may be silicon oxide, and the rest supporting layer 750 may be silicon nitride.

In an embodiment, the first contact structure 720 and the second contact structure 730 are vertically interconnected or interconnected in a staggered manner. In particular, a vertical interconnection means that a center of projection of the first contact structure 720 on the substrate overlaps a center of projection of the second contact structure on the substrate, and a staggered interconnection means that the center of the projection of the first contact structure 720 on the substrate does not overlap the center of the projection of the second contact structure on the substrate. The first contact structure 720 and the second contact structure 730 shown in FIG. 1 are in the staggered interconnection.

In an embodiment, the columnar capacitor array 200 includes a first electrode layer 210, a capacitor dielectric layer 220, and a second electrode layer 230. The first electrode layer 210, the capacitor dielectric layer 220, and the second electrode layer 230 are all arranged in the memory array region 100A.

The first electrode layer 210 is arranged on the substrate. The first electrode layer 210 includes a plurality of columnar structures arranged in an array. Further, the columnar structures of the first electrode layer 210 of the embodiment have a cavity penetrating in the direction perpendicular to the substrate. Illustratively, the cavity may be, but is not limited to, a cylindrical hole, an inverted trapezoidal hole, a rectangular hole, and the like. Illustratively, an inner wall of a columnar structure of the first electrode layer 210 may have an irregular shape, such as an arc shape or a wave shape, and the embodiment does not specifically limit the shapes of the columnar structures of the first electrode layer 210. Material of the first electrode layer 210 may be polysilicon or metal, may also be a laminated structure of metal and titanium nitride, and may also be zero-doped and/or doped polysilicon.

Further, the supporting layer 750 of the semiconductor device is connected to an outer wall of the plurality of columnar structures of the first electrode layer 210 to maintain structure stability of the first electrode layer 210. In the embodiment shown in FIG. 1, the semiconductor device includes two supporting layers 750, one supporting layer 750 is disposed on the top of the plurality of columnar structures of the first electrode layer 210, and the other supporting layer 750 is disposed in the middle of the plurality of columnar structures of the first electrode layer 210.

The capacitor dielectric layer 220 covers an inner surface and an outer surface of the first electrode layer 210. In particular, the material of the capacitor dielectric layer 220 is a high-K dielectric layer having a dielectric constant greater than 7. Illustratively, the material of the capacitor dielectric layer 220 may be metal oxide. Further, the capacitor dielectric layer 220 may also be a laminated structure, such as a two-layer structure of hafnium oxide and zirconium oxide, to further improve the performance of a memory capacitor. Through arrangement of the capacitor dielectric layer 220 on the inner surface and outer surface of the first electrode layer 210, the utilization rate of the surface of the first electrode layer 210 may be effectively improved so as to form a columnar capacitor having larger electrode area.

The second electrode layer 230 covers the surface of the capacitor dielectric layer 220. In particular, the second electrode layer 230 is arranged on the inner surface and outer surface of the capacitor dielectric layer 220, that is, the second electrode may constitute the columnar capacitor together with the capacitor dielectric layer 220 inside the first electrode layer 210 of the columnar structure of the first electrode layer 210, or the second electrode layer may also constitute the columnar capacitor together with the capacitor dielectric layer 220 outside the first electrode layer 210 of the columnar structure of the first electrode layer 210. The second electrode layer 230 may be a single layer or laminated structure. When the second electrode layer 230 is a single layer structure, the material of the second electrode layer 230 may be polysilicon or metal. When the second electrode layer 230 is a laminated structure, the second electrode layer 230 may be composed of metal and titanium nitride together.

Therefore, in the embodiment, the first electrode layer 210, the capacitor dielectric layer 220, and the second electrode layer 230 may form a double-sided columnar capacitor at each of the columnar structure of the first electrode layer 210, and further constitute the columnar capacitor array. In the embodiment, the first electrode layer 210, the capacitor dielectric layer 220, and the second electrode layer 230 are configured together to form the columnar capacitor array 200, that is, to form a double-sided columnar capacitor structure having a relatively large storage capacity.

In an embodiment, referring to FIG. 1, the semiconductor device further includes an electrode filling layer 600. The electrode filling layer 600 covers the surface of the second electrode layer 230 and fills up a gap formed by the second electrode layer 230. In particular, the electrode filling layer 600 covers the surface of the second electrode layer 230 and fills up gaps between the second electrode layers 230, that is, the electrode filling layer 600 fills up gaps between the adjacent columnar structures of the first electrode layer 210. Further, the material of the electrode filling layer 600 may be un-doped polysilicon or doped polysilicon. The doped polysilicon may be, for example, boron-doped polysilicon. The electrode filling layer 600 may prevent the second electrode layer 230 from being in contact with an external environment, thereby preventing oxidation or corrosion of the second electrode layer 230, improving the stability of the second electrode layer 230 and further improving the reliability of the semiconductor device.

In an embodiment, referring to FIG. 1, a plurality of contact nodes 110 is also formed in the substrate. The bottoms of the columnar structures of the first electrode layer 210 are connected in one-to-one correspondence with the contact nodes 110 in the memory array region 100A, and the first contact structure 720 is connected with the contact node 110 in the peripheral region 100B. In particular, a plurality of contact nodes 110 arranged in an array is formed in the memory array region 100A of the substrate. The projections of the contact nodes 110 on the substrate overlap the projections of a plurality of columnar structures in the first electrode layer 210 on the substrate, so that the bottoms of the columnar structures of the first electrode layer 210 are respectively electrically connected with the contact nodes 110 in the memory array region 100A, and the contact node 110 is electrically connected to the first electrode layer 210. A conductive structure may be also formed in the peripheral region 100B of the substrate. The first contact structure 720 in the first interlayer insulation layer 741 and the second interlayer insulation layer 742 is electrically connected to the contact node 110 in the peripheral region 100B to acquire a control signal from the contact node 110.

In an embodiment, referring to FIG. 1, the semiconductor device may further include a peripheral structure 500 located around an edge of the columnar capacitor array 200. The peripheral structure 500 is formed in the first interlayer insulation layer 741 and the second interlayer insulation layer 742.

Further, the top of the peripheral structure 500 is flush with the top of the first electrode layer 210. By enabling the top of the peripheral structure 500 to be flush with the top of the first electrode layer 210, a supporting force of the peripheral structure 500 for the top of the first electrode layer 210 may be increased to prevent the top from collapsing when the semiconductor device is prepared. Further, the bottom of the peripheral structure 500 may extend down to the surface of the substrate, so that height of the peripheral structure 500 is the same as the height of the columnar capacitor array. The height refers to the dimension of a device structure along the direction perpendicular to the substrate. In another embodiment, the height of the peripheral structure 500 may be higher than the height of the columnar capacitor structure, or the height of the peripheral structure 500 may be 1/2, 2/3, or the like of the height of the columnar capacitor structure. However, the peripheral structure 500 and the columnar capacitor array which are arranged at the same height may obtain a better supporting effect while a less internal volume of the device is occupied; therefore, the reliability of the columnar capacitor structure is effectively improved. The peripheral structure 500 may provide stable protection for preparation and use procedures of the columnar capacitor, thereby effectively improving the stability and reliability in the preparation procedure of the columnar capacitor, and improving the preparation yield and the service life of the semiconductor device.

In an embodiment, a ring width of an annular peripheral structure 500 is greater than or equal to twice an inner diameter of the columnar structure of the first electrode layer 210. In particular, in the preparation procedure of the embodiment, when the peripheral structure 500 is filled, the top of the columnar structure of the first electrode layer 210 is also in an open state, that is, the cavity in the columnar structure of the first electrode layer 210 is also filled while the peripheral structure 500 is filled, however, the cavity in the columnar structure of the first electrode layer 210 needs to be configured to form the columnar capacitor, and therefore, after the peripheral structure 500 is filled, a filler in the cavity in the columnar structure of the first electrode layer 210 needs to be cleaned so as not to effect the performance of the columnar capacitor.

It will be appreciated that the above cleaning step may complicate a process step and also have a risk of affecting the performance of the device; therefore, filler ingress into the cavity should be avoided as much as possible. In an embodiment, through arrangement of the ring width of the peripheral structure 500 to be greater than or equal to twice the inner diameter of the columnar structure of the first electrode layer 210, an opening on the top of the columnar structure of the first electrode layer 210 may be quickly closed in a filling procedure, so that the filler may not enter the cavity, the content of the filler in the cavity is reduced, and the complexity of the process step is reduced.

Figure 2:
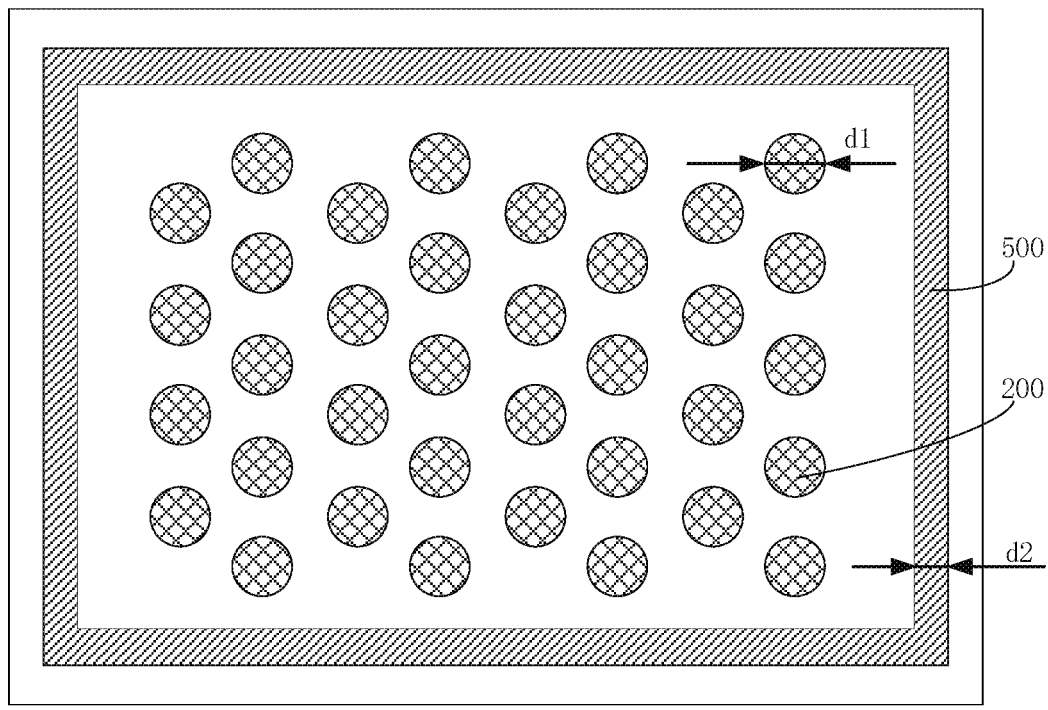
FIG. 2 is a schematic top view of a first electrode layer and a peripheral structure of an embodiment.

Further, the ring width of the peripheral structure 500 may be equal to twice the inner diameter of the columnar structure of the first electrode layer 210. Illustratively, FIG. 2 is a schematic top view of a first electrode layer 210 and a peripheral structure 500 of an embodiment, for the sake of illustration, only the first electrode layer 210 and the peripheral structure 500 are shown in FIG. 2. Referring to FIG. 2, the diameter d1 of the columnar structure of the first electrode layer 210 may be 40 nm, and the ring width d2 of the peripheral structure 500 may be 80 nm. Through such an arrangement of the embodiment, the peripheral structure 500 may achieve a desired protection effect with a relatively small structure volume. It is to be noted that if the size of the columnar capacitor structure is further reduced, or the aspect ratio of the columnar capacitor is further increased, it is necessary to make the ring width of the peripheral structure 500 larger to ensure its supporting effect, for example, to make the ring width of the peripheral structure 500 equal to three or four times the inner diameter of the columnar structure of the first electrode layer 210.

In an embodiment, the peripheral structure 500 may be a circumferentially closed or discontinuous structure. Referring to FIG. 2, circumferential closure means that when the peripheral structure 500 is sectioned along the direction parallel to the substrate, and a section of the peripheral structure 500 is a closed loop. In the embodiment, by arranging the peripheral structure 500 to be the circumferential closed structure, the semiconductor device may be supported with uniform stress in all directions, thereby avoiding damage to the columnar capacitor at a single side. In another embodiment, the discontinuous structure means that the peripheral structure 500 is discontinuously arranged in an annular extension direction thereof. For example, if the arrangement density of the columnar capacitor array is gradually changed, the peripheral structure 500 may not be arranged at the side with relatively sparse columnar capacitor arrangement, and the peripheral structure 500 may be arranged only at the side with relatively dense columnar capacitor arrangement, so that the peripheral structure 500 of a U-shaped structure is formed, therefore, the volume of the peripheral structure 500 is reduced, and a more integrated semiconductor device is provided.

Figure 3:
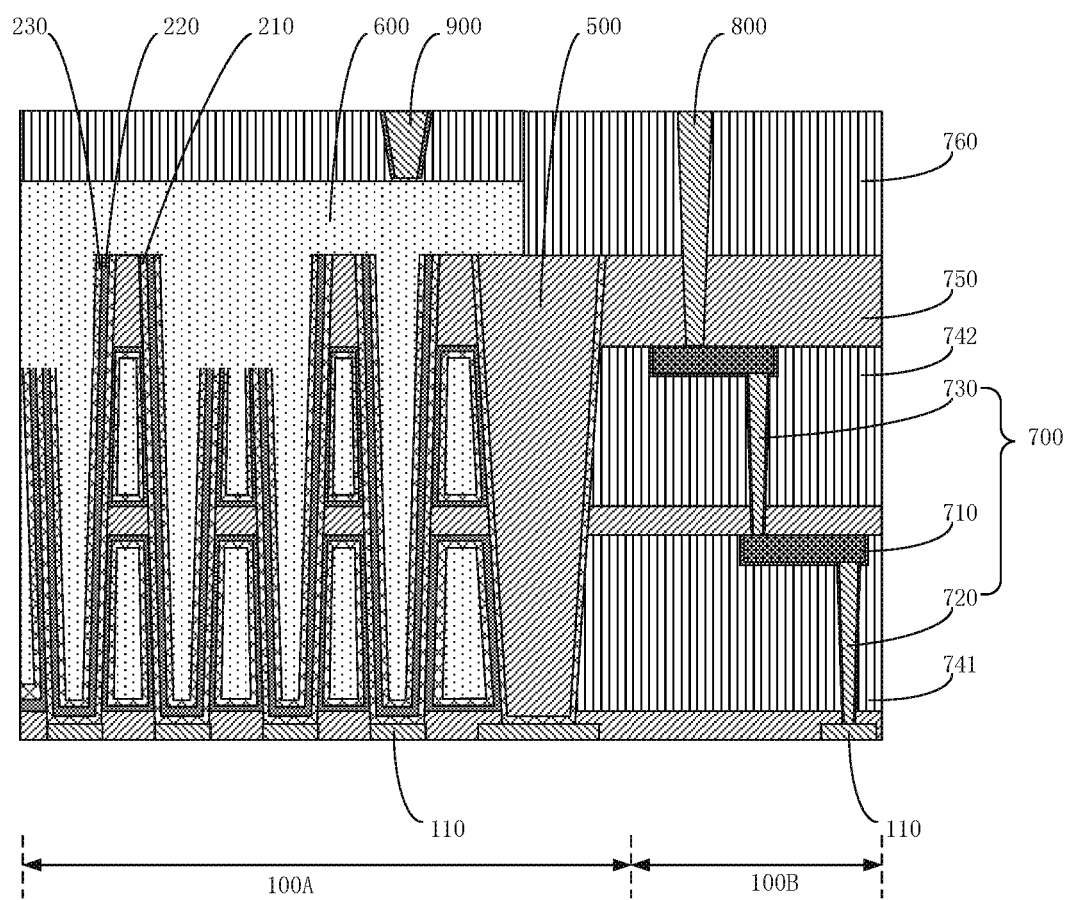
FIG. 3 is a schematic cross-sectional view of a semiconductor device of another embodiment.

FIG. 3 is a schematic cross-sectional view of a semiconductor device of another embodiment. Referring to FIG. 3, in the embodiment, the semiconductor device may further include a third contact structure 800 and a fourth contact structure 900. The bottom of the third contact structure 800 is connected with the second electrode layer 230, and the bottom of the fourth contact structure 900 is connected with the contact structure 700. The top of the fourth contact structure 900 is flush with the top of the third contact structure 800. In the embodiment, the fourth contact structure 900 is electrically connected to the columnar capacitor through the second electrode layer 230, and the third contact structure 800 is electrically connected to the contact node 110 in the peripheral region 100B through the contact structure 700. Further, if the surface of the second electrode layer 230 is also filled with the electrode filling layer 600, the fourth contact structure 900 is electrically connected to the columnar capacitor through the electrode filling layer 600 and the second electrode layer 230.

Figure 4:
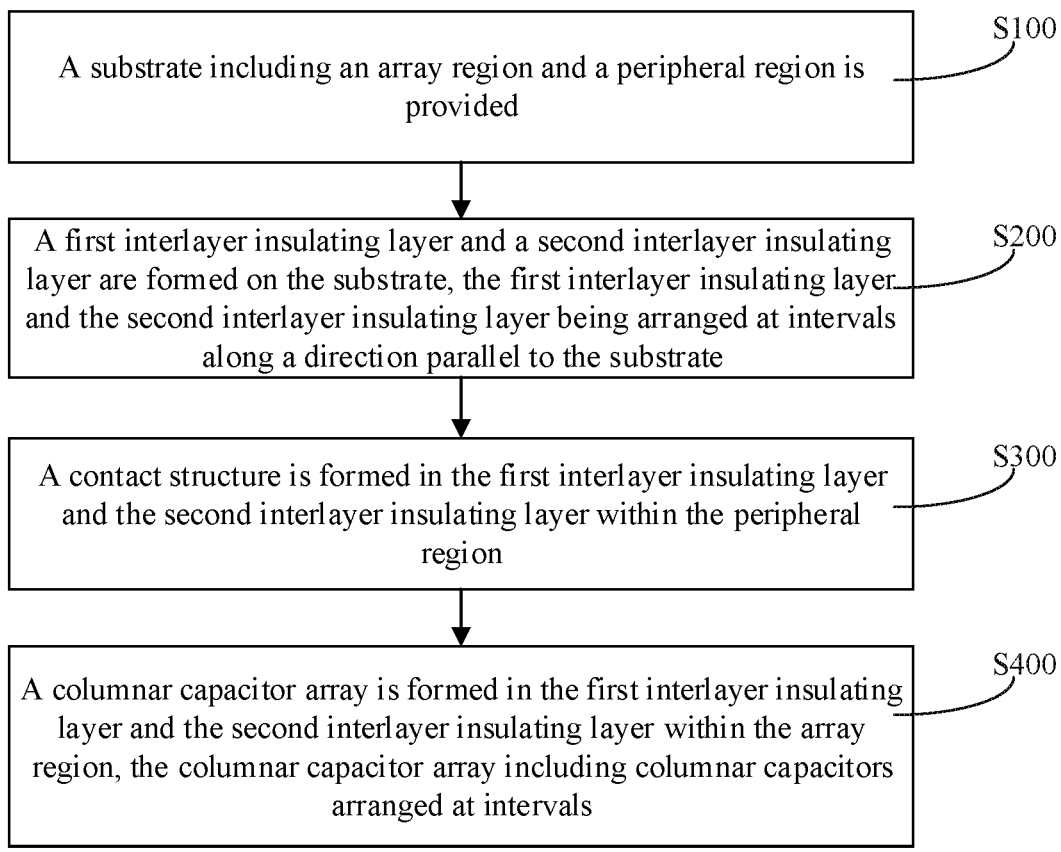
FIG. 4 is a flow chart of a method for forming a semiconductor device of an embodiment.

FIG. 4 is a flow chart of a method for forming a semiconductor device of an embodiment. Referring to FIG. 4, in the embodiment, the method for forming a semiconductor device includes S100 to S400.

S100: a substrate is provided. The substrate includes a memory array region 100A and a peripheral region 100B. Material of the substrate may be monocrystalline silicon, polysilicon, silicon-on-insulator (SOI), and the like, or other material known to those skilled in the art. The substrate is divided into the memory array region 100A and the peripheral region 100B. Contact nodes 110 are formed in both the memory array region 100A and the peripheral region 100B of the substrate, and a plurality of contact nodes 110 in the memory array region 100A of the substrate are arranged in an array.

S200: a first interlayer insulation layer 741 and a second interlayer insulation layer 742 are formed on the substrate. The first interlayer insulation layer 741 and the second interlayer insulation layer 742 are arranged at intervals along a direction parallel to the substrate.

S300: a contact structure 700 is formed in the first interlayer insulation layer 741 and the second interlayer insulation layer 742 within the peripheral region 100B.

S400: a columnar capacitor array 200 is formed in the first interlayer insulation layer 741 and the second interlayer insulation layer 742 within the memory array region 100A. The columnar capacitor array 200 includes columnar capacitors arranged at intervals.

In an embodiment, at S200, the first interlayer insulation layer 741 and the second interlayer insulation layer 742 may be formed on the surface of the substrate via processes such as chemical vapor deposition, spin coating, and the like. In order to improve the supporting ability of the columnar capacitors, a supporting layer 750 may be formed on the surface of the first interlayer insulation layer 741 and/or on the surface of the second interlayer insulation layer 742 to further improve a supporting force. That is, the first interlayer insulation layer 741, one supporting layer 750, the second interlayer insulation layer 742, and the other supporting layer 750 may be sequentially alternately laminated on the substrate. The supporting layer 750 may be configured to provide bottom support for the subsequently-formed first electrode layer 210 on the one hand, and may also be configured to isolate an element in the substrate from the element such as the columnar capacitors to be formed on the other hand.

Further, the supporting layer 750 may be formed by using a thermal oxidation process. Material of the supporting layer 750 may be, but is not limited to, silicon nitride. The material of the first interlayer insulation layer 741 and the material of the second interlayer insulation layer 742 may be, but is not limited to, silicon oxide. Thickness of the first interlayer insulation layer 741 and thickness of the second interlayer insulation layer 742 define height of the subsequently-formed supporting layer 750. Therefore, the thickness of the first interlayer insulation layer 741 and the thickness of the second interlayer insulation layer 742 may be adjusted according to the height of the supporting layer 750 needing to be formed.

In other embodiments, for better supporting the first electrode layer 210, three or four supporting layers 750 may be arranged. After the semiconductor device is finally formed, all of the first interlayer insulation layer 741 and the second interlayer insulation layer 742 in the memory array region 100A are removed, while the first interlayer insulation layer 741 and the second interlayer insulation layer 742 in the peripheral region 100B are reserved.

In an embodiment, S300 in the method for forming a semiconductor device includes that: a first contact structure 720 and a second contact structure 730 which are interconnected are formed in the first interlayer insulation layer 741 and the second interlayer insulation layer 742 in the peripheral region 100B. The first contact structure 720 or the second contact structure 730 is interconnected by penetrating the first interlayer insulation layer 741 or the second interlayer insulation layer 742. Further, the step that a first contact structure 720 and a second contact structure 730 which are interconnected are formed in the first interlayer insulation layer 741 and the second interlayer insulation layer 742 in the peripheral region 100B may include that: the first contact structure 720 and the second contact structure 730 which are vertically interconnected or interconnected in a staggered manner are formed in the first interlayer insulation layer 741 and the second interlayer insulation layer 742 in the peripheral region 100B.

In some embodiments, the first interlayer insulation layer 741 and the second interlayer insulation layer 742 may be formed on the substrate first, and then the contact structure 700 is formed in the first interlayer insulation layer 741 and the second interlayer insulation layer 742 in the peripheral region 100B.

Figure 5:
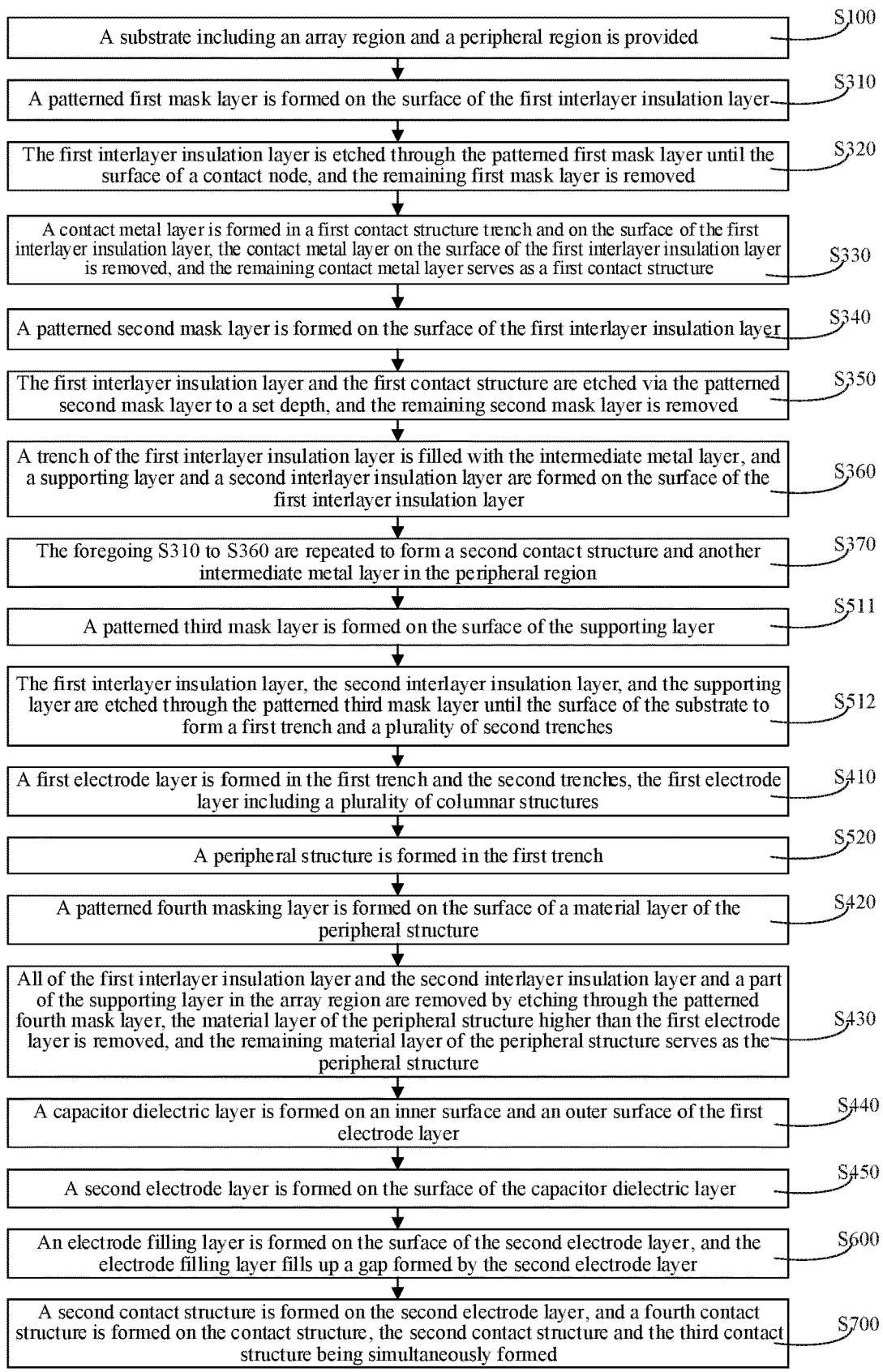
FIG. 5 is a flow chart of a method for forming a semiconductor device of another embodiment.

FIG. 5 is a flow chart of a method for forming a semiconductor device of another embodiment. Referring to FIG. 5, in other embodiments, S200 and S300 may be performed alternately, for example, the first interlayer insulation layer 741 is formed first, and a part of the contact structure 700 is formed in the first interlayer insulation layer 741, and then the second interlayer insulation layer 742 is formed, and the rest contact structure 700 is formed in the first interlayer insulation layer 741. By using an alternate-performing method, it is more convenient to form the contact structure 700 with more structure layers and better electrical performance. Referring to FIG. 5, in the embodiment, S200 and S300 collectively include S310 to S370.

Figure 6:
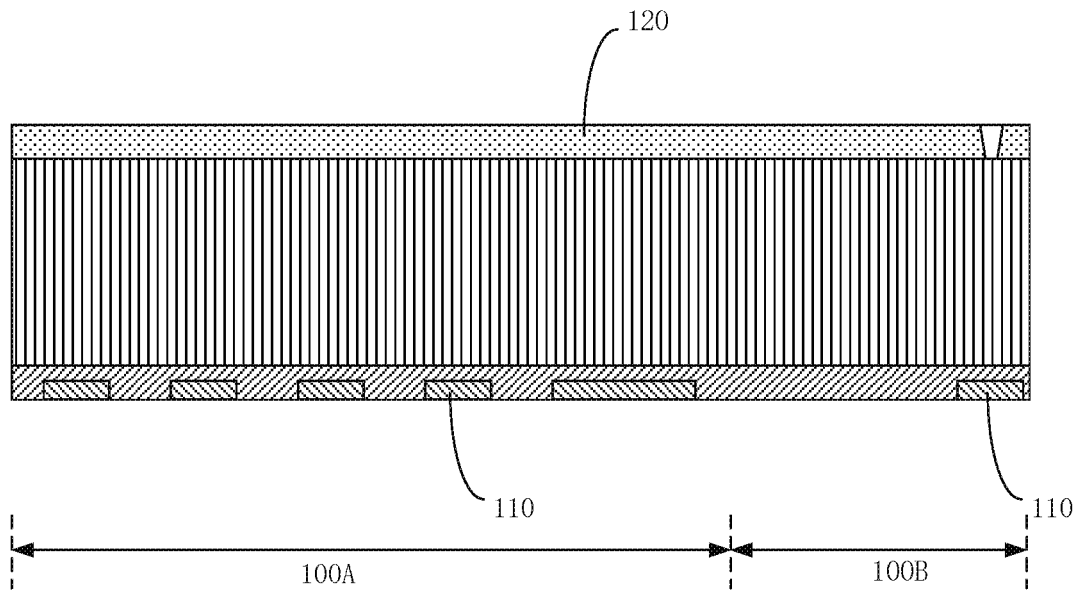
FIG. 6 is a schematic cross-sectional view of a semiconductor device after step S310.

S310: a patterned first mask layer 120 is formed on the surface of the first interlayer insulation layer 741. FIG. 6 is a schematic cross-sectional view of a semiconductor device after S310. Referring to FIG. 6, after S310, the first mask layer 120 is formed with an opening. The opening exposes a part of the first interlayer insulation layer 741. Projection of the opening in the direction perpendicular to the substrate overlaps the contact node 110 in the peripheral region 100B. The first mask layer 120 is configured to form a first contact structure trench 721. It is to be noted that the first mask layer 120 may be a photoresist mask layer or a hard mask layer. The embodiments of the present application do not specifically restrict the material of the first mask layer 120. A mask layer formed at other steps may be the same as or different from the material of the first mask layer 120 in the present step, which is not specifically limited in the embodiments of the present application, and further description will not be given in other steps.

Figure 7:
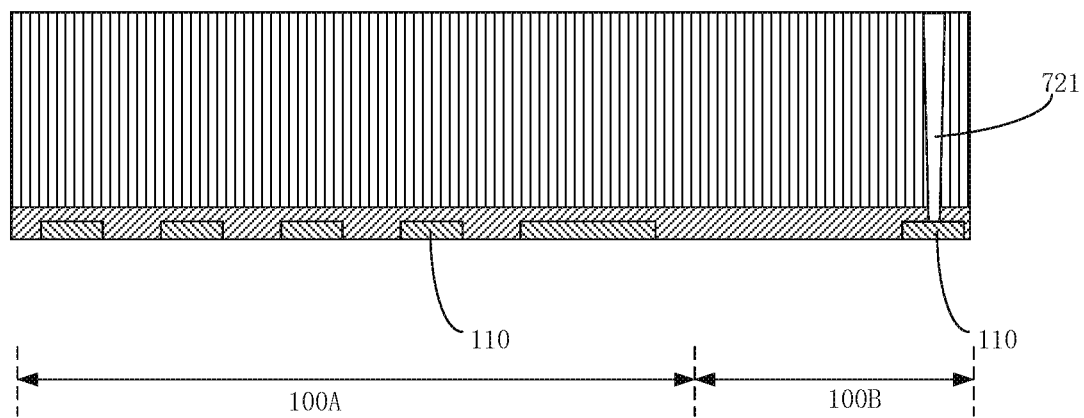
FIG. 7 is a schematic cross-sectional view of a semiconductor device after step S320.

S320: the first interlayer insulation layer 741 is etched through the patterned first mask layer until the surface of the contact node 110, and the remaining first mask layer 120 is removed. FIG. 7 is a schematic cross-sectional view of a semiconductor device after S320. Referring to FIG. 7, after S320, the first contact structure trench 721 penetrating along the vertical direction is formed in the first interlayer insulation layer 741, and the size of the first contact structure trench 721 along the horizontal plane is smaller than the size of the contact node 110.

Figure 8:
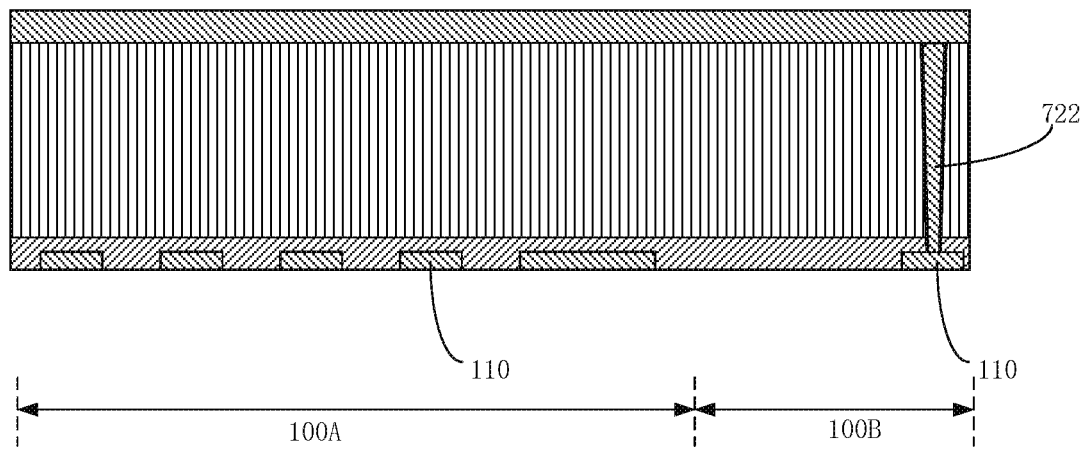
FIG. 8 is a schematic cross-sectional view of a semiconductor device after a contact metal layer is formed in step S330.
Figure 9:
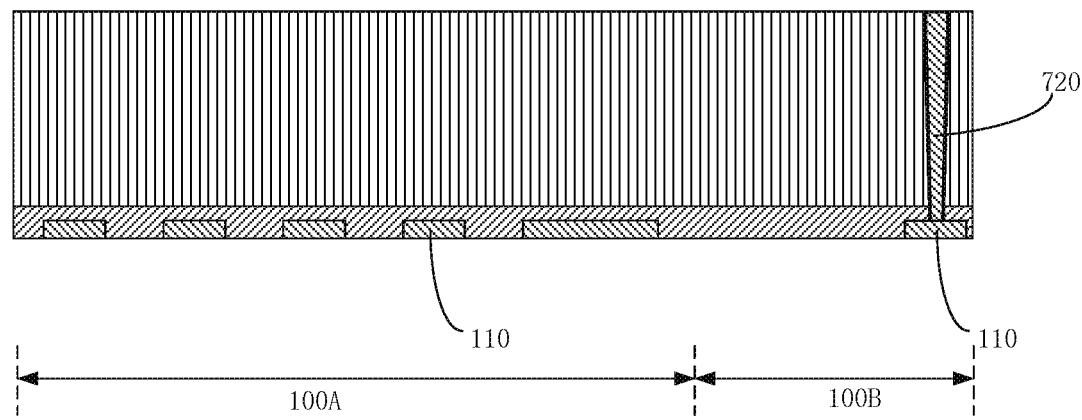
FIG. 9 is a schematic cross-sectional view of a semiconductor device after step S330.

S330: a contact metal layer 722 is formed in the first contact structure trench 721 and on the surface of the first interlayer insulation layer 741. The contact metal layer 722 on the surface of the first interlayer insulation layer 741 is removed, and the remaining contact metal layer 722 serves as the first contact structure 720. FIG. 8 is a schematic cross-sectional view of a semiconductor device after a contact metal layer 722 is formed in S330, and FIG. 9 is a schematic cross-sectional view of a semiconductor device after S330. Referring to FIG. 8 and FIG. 9, after S330, the first contact structure trench 721 is completely filled with the first contact structure 720, thereby guiding the signal of the contact node 110. The material of the first contact structure 720 may be, but is not limited to, tungsten.

Figure 10:
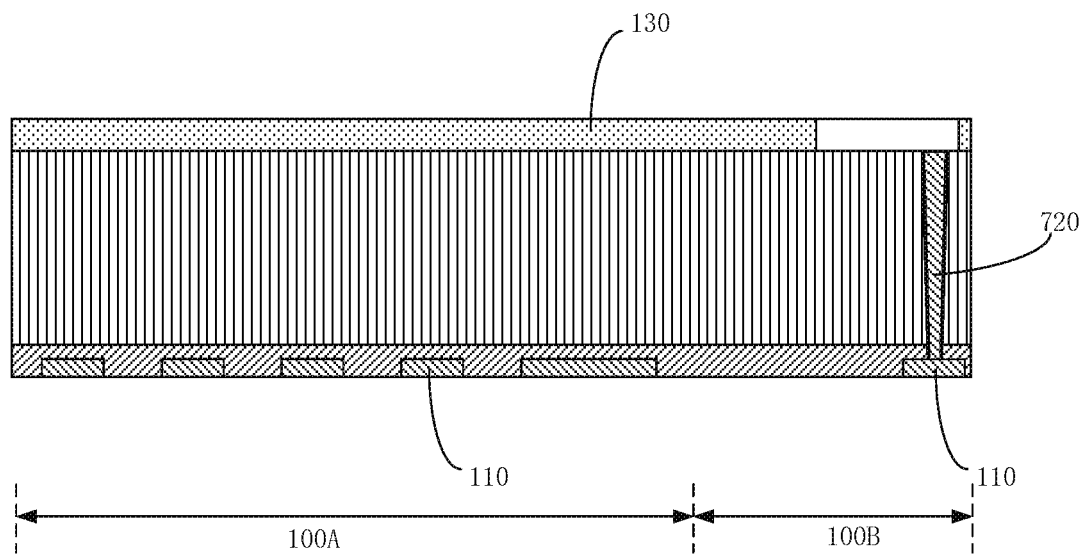
FIG. 10 is a schematic cross-sectional view of a semiconductor device after step S340.

S340: a patterned second mask layer 130 is formed on the surface of the first interlayer insulation layer 741. FIG. 10 is a schematic cross-sectional view of a semiconductor device after S340. Referring to FIG. 10, after S340, an opening is formed in the second mask layer 130. The opening exposes the top of the first contact structure 720 and a part of the first interlayer insulation layer 741. The size of the opening in the second mask layer 130 along the horizontal plane is greater than that of the contact node 110 and that of the first contact structure 720. By forming a larger opening, a larger-sized intermediate electrode layer may be formed in a subsequent step, thereby improving contact reliability of the contact structure 700 and reducing contact resistance.

Figure 11:
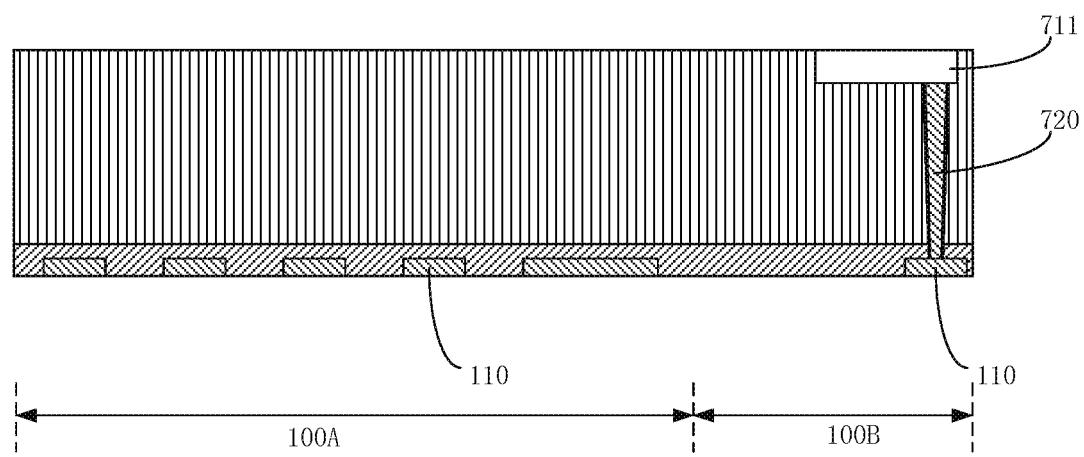
FIG. 11 is a schematic cross-sectional view of a semiconductor device after step S350.

S350: the first interlayer insulation layer 741 and the first contact structure 720 are etched via the patterned second mask layer 130 to a set depth, and the remaining second mask layer 130 is removed. FIG. 11 is a schematic cross-sectional view of a semiconductor device after S350. Referring to FIG. 11, after S350, a trench whose size and thickness are equivalent to the size and thickness of an intermediate metal layer 710 to be formed is formed in the first interlayer insulation layer 741.

S360: the trench of the first interlayer insulation layer 741 is filled with the intermediate metal layer 710, and the supporting layer 750 and the second interlayer insulation layer 742 are formed on the surface of the first interlayer insulation layer 741.

S370: the foregoing S310 to S360 are repeated to form the second contact structure 730 and another intermediate metal layer 710 in the peripheral region 100B.

Figure 12:
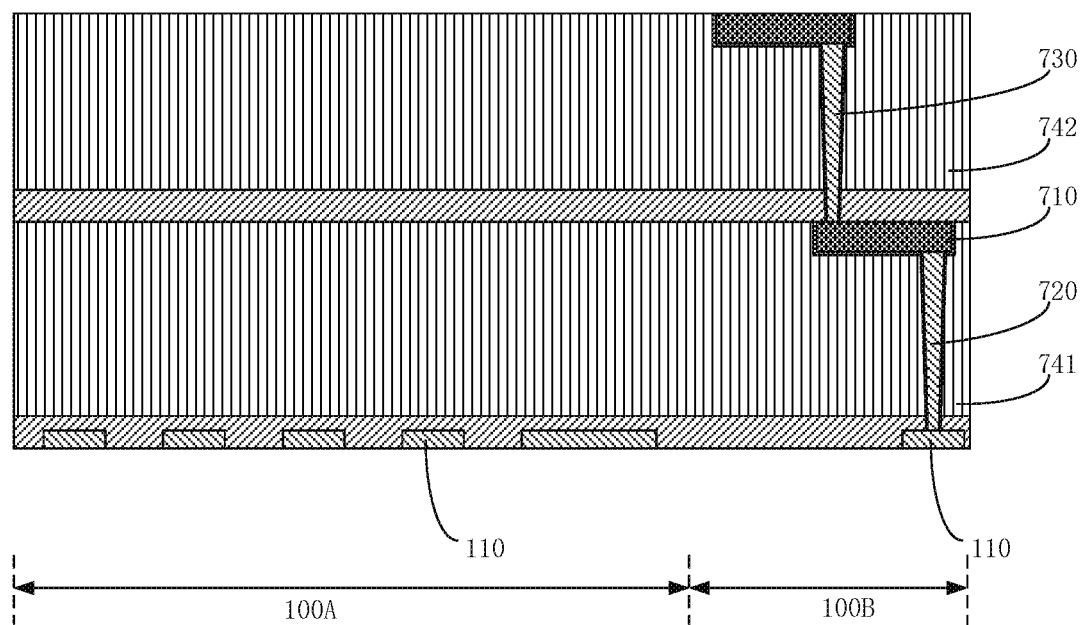
FIG. 12 is a schematic cross-sectional view of a semiconductor device after step S370.

Through the above S310 to S370, the contact structure 700 including the first contact structure 720, the second contact structure 730 and the two intermediate metal layers 710 as shown in FIG. 12 may be formed. Through the method for forming the contact structure 700 of the embodiment, not only a length of the contact structure 700 may be effectively shortened to reduce an overall resistance value of the contact structure 700, but also the contact structure 700 may be enabled to have a certain length in a plane parallel to the substrate, thereby shortening the length of a connection path of the memory array region 100A and the peripheral region 100B in the horizontal plane.

In an embodiment, before S400, S500 is further included.

S500: a peripheral structure 500 is formed in the first interlayer insulation layer 741 and the second interlayer insulation layer 742. The peripheral structure 500 is located around an edge of the columnar capacitor array 200. In particular, in an embodiment, S500 may include S510 and S520.

S510: a first trench 510 and a plurality of second trenches 211 are formed in the first interlayer insulation layer 741 and the second interlayer insulation layer 742. The plurality of second trenches 211 are arranged in an array, and the first trench 510 is annularly arranged around the entire outer contour of the plurality second trenches 211.

In particular, the first trench 510 is configured to form the peripheral structure 500, and the plurality of second trenches 211 is configured to form the columnar capacitor array 200. In the embodiment, the trench of the peripheral structure 500 and the trench of the columnar capacitor array 200 may be simultaneously formed in one step, so that the preparation can be simplified, and the higher preparation efficiency can be achieved. When the semiconductor device includes the first interlayer insulation layer 741, the second interlayer insulation layer 742, and the supporting layer 750, the first trench 510 and the plurality of second trenches 211 are formed in the first interlayer insulation layer 741, the second interlayer insulation layer 742, and the supporting layer 750. The plurality of second trenches 211 are arranged in an array, and the first trench 510 is annularly arranged around the entire outer contour of the plurality of second trenches 211.

In an embodiment, S510 may include S511 and S512.

Figure 13:
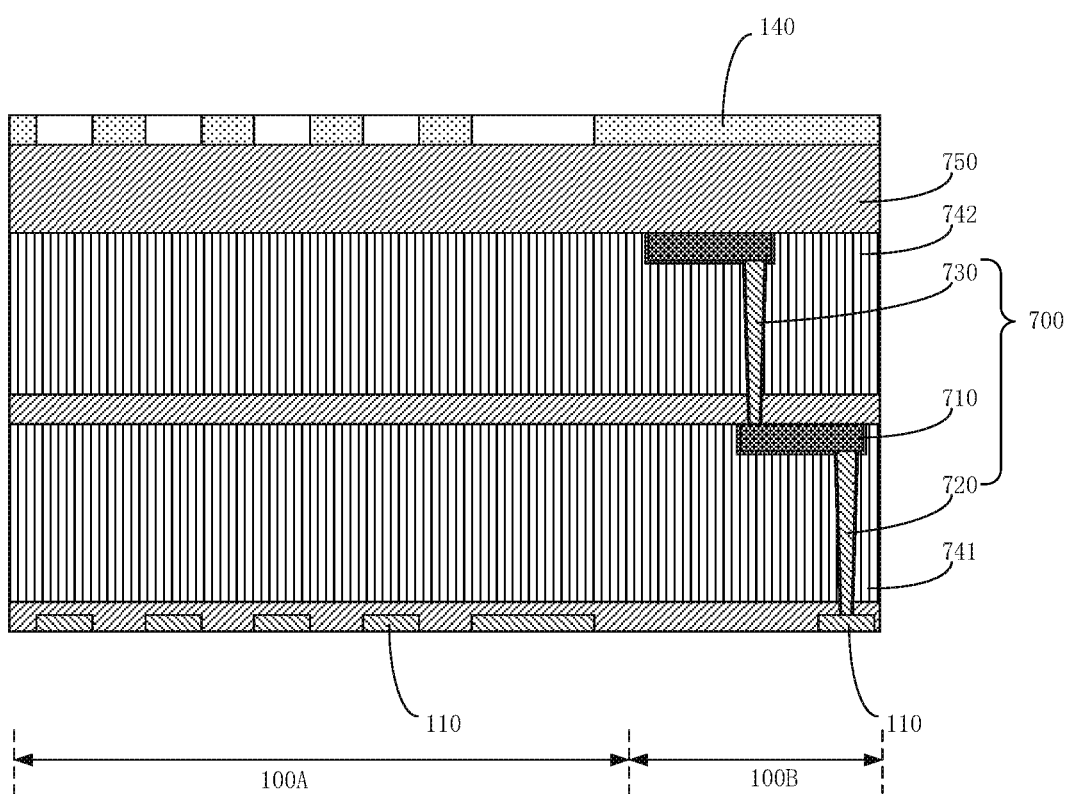
FIG. 13 is a schematic cross-sectional view of a semiconductor device after step S511.

S511: a patterned third mask layer 140 is formed on the surface of the supporting layer 750. FIG. 13 is a schematic cross-sectional view of a semiconductor device after S511. Referring to FIG. 13, after S511, the third mask layer 140 exposes a part of the supporting layer 750.

S512: the first interlayer insulation layer 741, the second interlayer insulation layer 742, and the supporting layer 750 are etched through the patterned third mask layer 140 until the surface of the substrate to form the first trench 510 and the plurality of second trench 211. The plurality of second trenches 211 are arranged in an array, and the first trench 510 is annularly arranged around the entire outer contour of the plurality of second trenches 211. In particular, a plurality of supporting layers 750, the first interlayer insulation layer 741, and the second interlayer insulation layer 742 are etched by using the patterned third mask layer 140 as a mask, to remove a part of the supporting layer 750, a part of the first interlayer insulation layer 741, and a part of the second interlayer insulation layer 742 in the memory array region 100A, a plurality of second trenches 211 are formed in the memory array region 100A, and then the patterned third mask layer 140 is removed.

Figure 14:
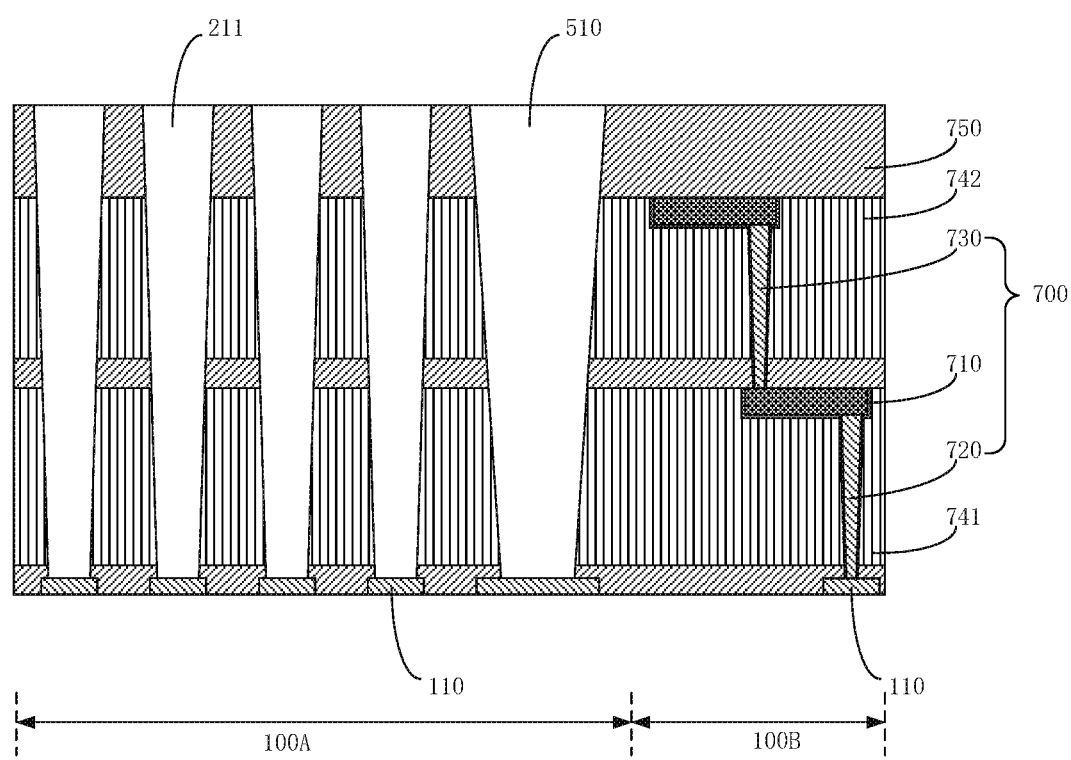
FIG. 14 is a schematic cross-sectional view of a semiconductor device after step S512.

FIG. 14 is a schematic cross-sectional view of a semiconductor device after S512. Referring to FIG. 14, after S512, the plurality of second trenches 211 are formed in the first interlayer insulation layer 741, the second interlayer insulation layer 742, and the supporting layer 750 within the memory array region 100A. Further, all of the second trenches 211 are arranged in hexagonal close packing. Still further, the second trench 211 may be an inverted trapezoidal hole, a rectangular hole, and the like, an inner wall thereof may be, for example, arc-shaped, and is not specifically limited in the embodiment. In addition, in the embodiment, the supporting layer 750, the first interlayer insulation layer 741, and the second interlayer insulation layer 742 are still reserved in the peripheral region 100B to protect the substrate in the peripheral region 100B in a subsequent process step of forming the columnar capacitors.

It will be appreciated that since the second trenches 211 need to be formed in the alternately laminated supporting layer 750, the first interlayer insulation layer 741, and the second interlayer insulation layer 742, and the first electrode layer 210 having a plurality of columnar structures may further be subsequently-formed on a bottom wall and an inner wall of the second trenches 211, the thickness of the first interlayer insulation layer 741 and/or the thickness of the second interlayer insulation layer 742 may be increased, thereby increasing the height of the first electrode layer 210 of the subsequently-formed columnar capacitor, increasing the surface area of the first electrode layer 210 of the columnar capacitor, and further increasing a capacitance value of the to-be-formed columnar capacitor.

S520: the peripheral structure 500 is formed in the first trench 510.

Figure 16:
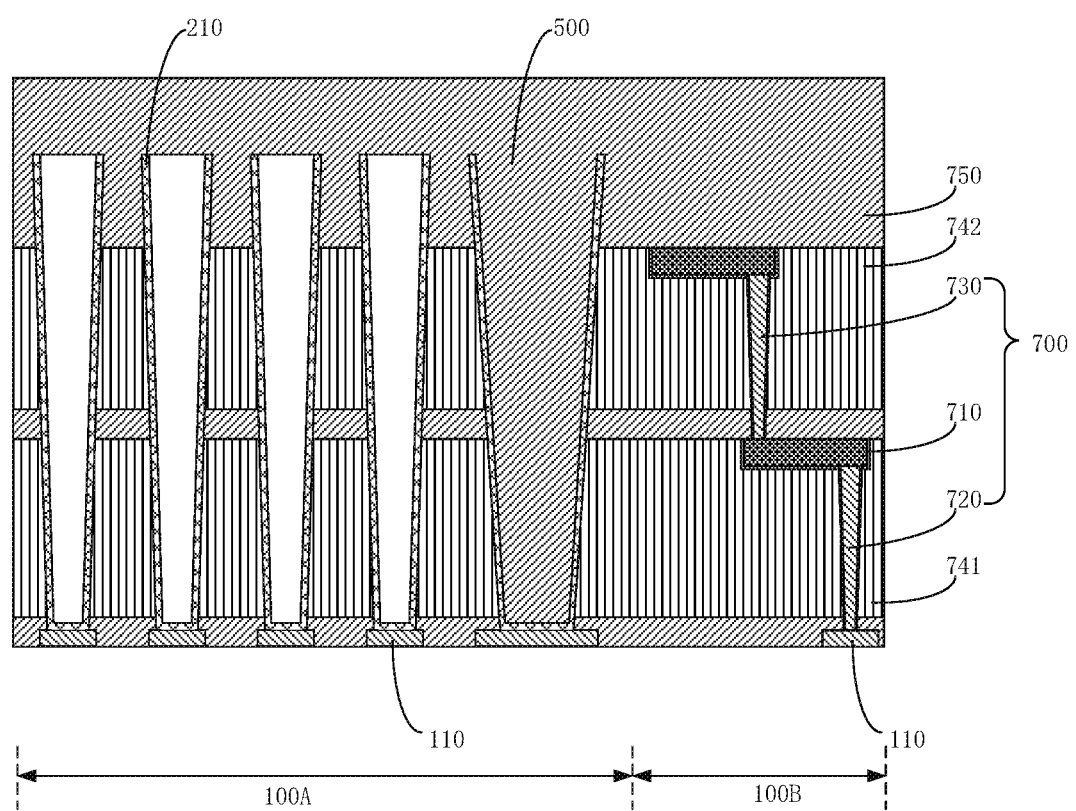
FIG. 16 is a schematic cross-sectional view of a semiconductor device after step S500.

In particular, FIG. 16 is a schematic cross-sectional view of a semiconductor device after S500. Referring to FIG. 16, after S500, the peripheral structure 500 may be formed via a deposition process in combination with a planarization process. For example, first, a material layer of the peripheral structure 500 is formed in the first trench 510 by using a process such as physical vapor deposition or chemical vapor deposition; and then the planarization process is performed to remove the material layer of the peripheral structure 500 on the top of the device to form a planar material layer of the peripheral structure 500.

In the embodiment, the material of the peripheral structure 500 may be at least one of silicon oxide, silicon nitride, silicon oxynitride, or silicon carbonitride. It will be appreciated that the material of the above peripheral structure 500 has high strength, so that through arrangement of the peripheral structure 500, the overall strength in the use of the semiconductor device may be improved, and device failure is avoided. Further, the peripheral structure 500 may also protect a device structure in a preparation procedure, thereby preventing failure of the columnar capacitor, improving the stability and reliability in the preparation procedure of the columnar capacitor, and further improving the preparation yield of the semiconductor device.

In an embodiment, S400 includes S410 to S450 to form the columnar capacitor array 200.

S410: the first electrode layer 210 is formed in the first trench 510 and the second trenches 211. The first electrode layer 210 includes a plurality of columnar structures.

Figure 15:
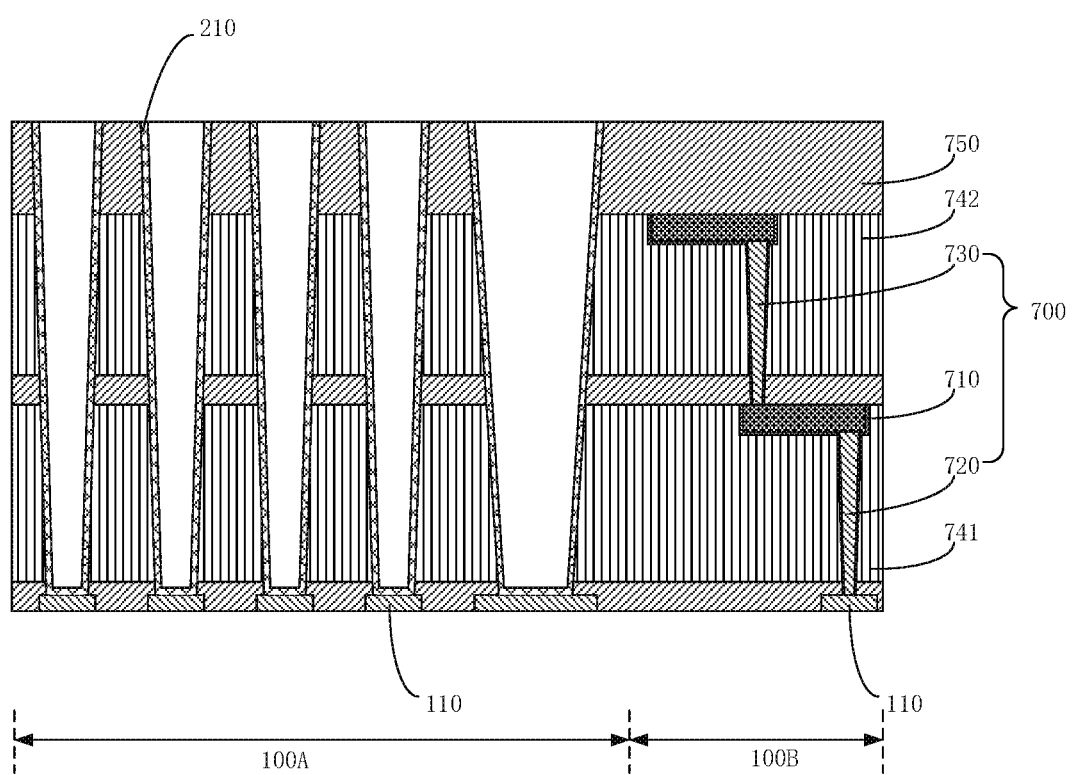
FIG. 15 is a schematic cross-sectional view of a semiconductor device after step S400.

In particular, FIG. 15 is a schematic cross-sectional view of a semiconductor device after S400. Referring to FIG. 15, after S410, the first electrode layer 210 is formed on the inner wall and bottom wall of both of the first trench 510 and the second trenches 211. The shape of the first electrode layer 210 formed in a second trench 211 is the same as that of a second trench 211, thereby forming the plurality of columnar structures of the first electrode layer 210. It will be appreciated that the first electrode layer 210 first formed in the trench may isolate the peripheral structure 500 from the first interlayer insulation layer 741 and the second interlayer insulation layer 742, and thus damage to the first interlayer insulation layer 741 and the second interlayer insulation layer 742 when the redundant material of the peripheral structure 500 is removed is prevented, thereby improving the reliability of the semiconductor device. Therefore, in the embodiment, S410 is set before S520.

Further, the first electrode layer 210 may be formed via the deposition process in combination with the planarization process. For example, first, an electrode material layer is formed on the surface of the supporting layer 750, and in the first trench 510 and the second trenches 211 by using the process such as physical vapor deposition or chemical vapor deposition; and then, the planarization process is performed to remove a part of the electrode material layer located on the supporting layer 750, so that only the electrode material layer in the first trench 510 and the second trenches 211 is reserved to constitute the first electrode layer 210 having the plurality of columnar structures.

In the embodiment, the contact nodes 110 in the memory array region 100A are exposed through the second trenches 211, so that the bottoms of the columnar structures of the formed first electrode layer 210 may be electrically connected with the contact nodes 110. The material of the first electrode layer 210 may be polysilicon or metal. When the material of the first electrode layer 210 is metal, a titanium nitride and Ti laminated structure may be used. When the first electrode layer 210 is polysilicon, zero-doped and/or doped polysilicon may be used.

Figure 17:
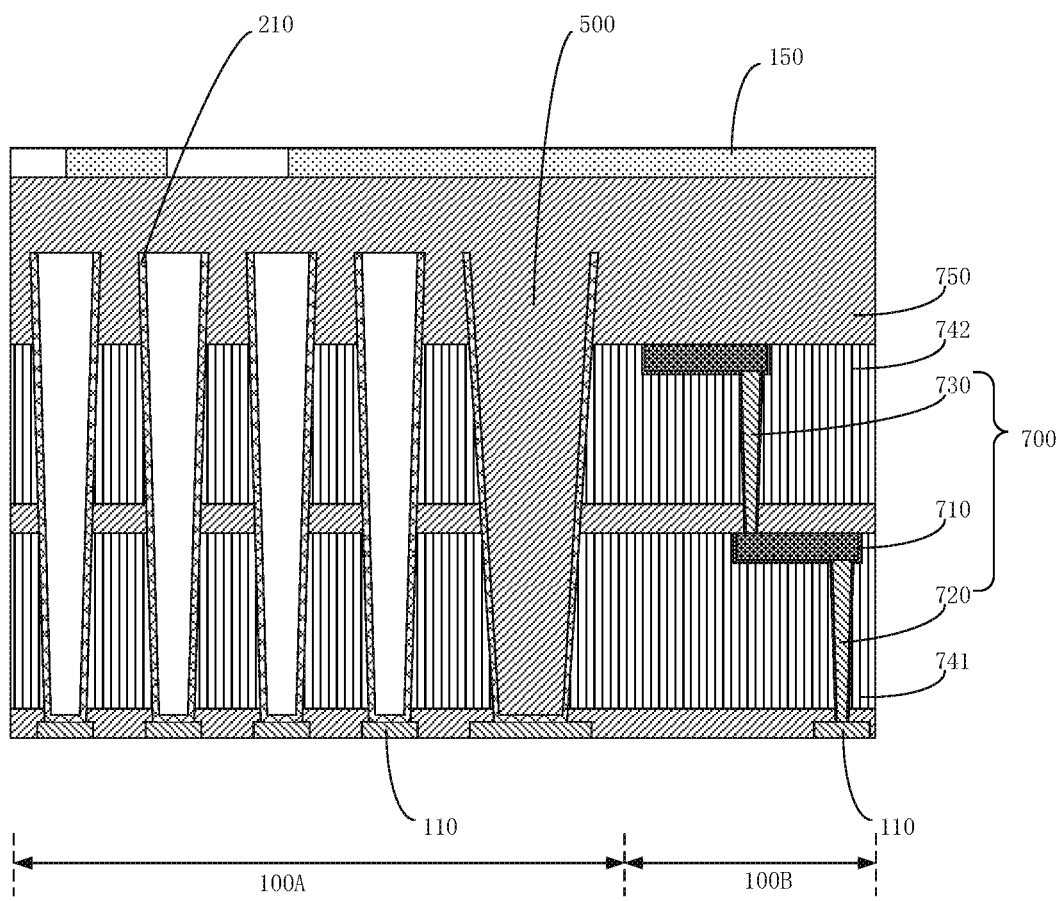
FIG. 17 is a schematic cross-sectional view of a semiconductor device after step S420.

S420: a patterned fourth masking layer 150 is formed on the surface of the material layer of the peripheral structure 500. In particular, FIG. 17 is a schematic cross-sectional view of a semiconductor device after S420. Referring to FIG. 17, after S420, a plurality of openings is formed in the fourth mask layer 150. The projection of each opening on the substrate partially overlaps the projections of the multiple columnar structures on the substrate, to remove respective first interlayer insulation layer 741 and respective second interlayer insulation layer 742 and reserve respective supporting layer 750. The plurality of openings in the fourth mask layer 150 are configured to form a plurality of capacitor opening holes in a subsequent step to remove the remaining first interlayer insulation layer 741 and the remaining second interlayer insulation layer 742 in the memory array region 100A.

S430: all of the first interlayer insulation layer 741 and the second interlayer insulation layer 742 and a part of the supporting layer 750 in the memory array region 100A are removed by etching through the patterned fourth mask layer 150, and the material layer of the peripheral structure 500 higher than the first electrode layer 210 is removed. The remaining material layer of the peripheral structure 500 serves as the peripheral structure 500.

Figure 18:
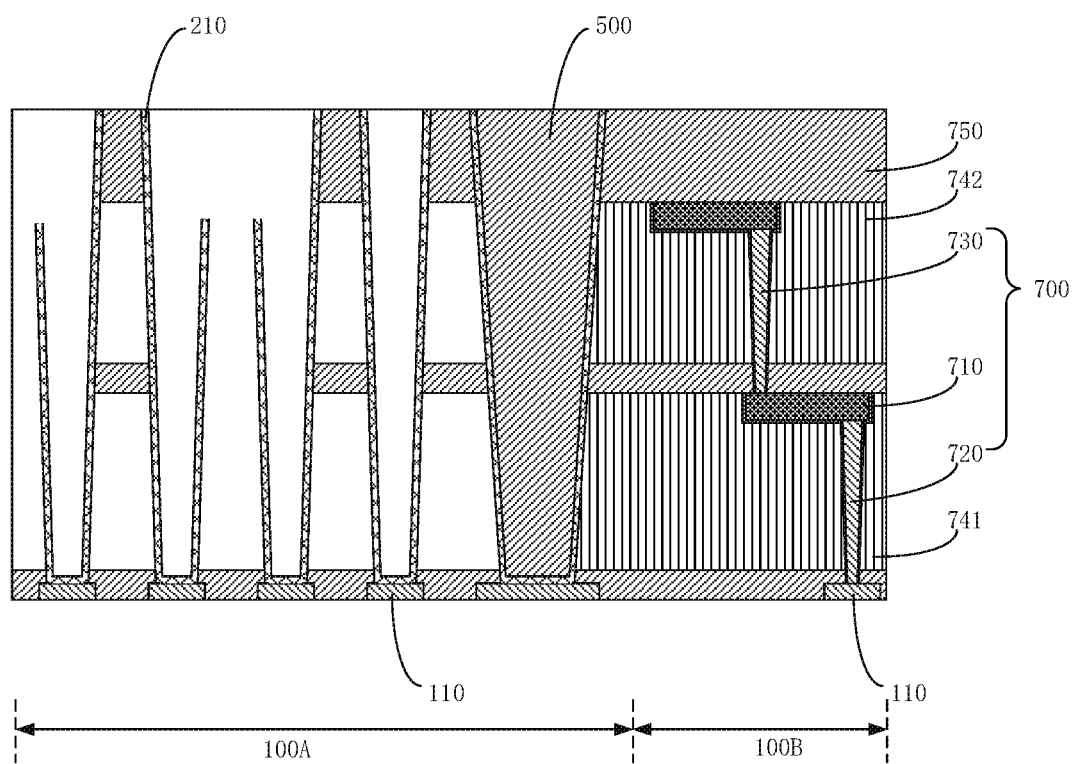
FIG. 18 is a schematic cross-sectional view of a semiconductor device after step S430.
Figure 19:
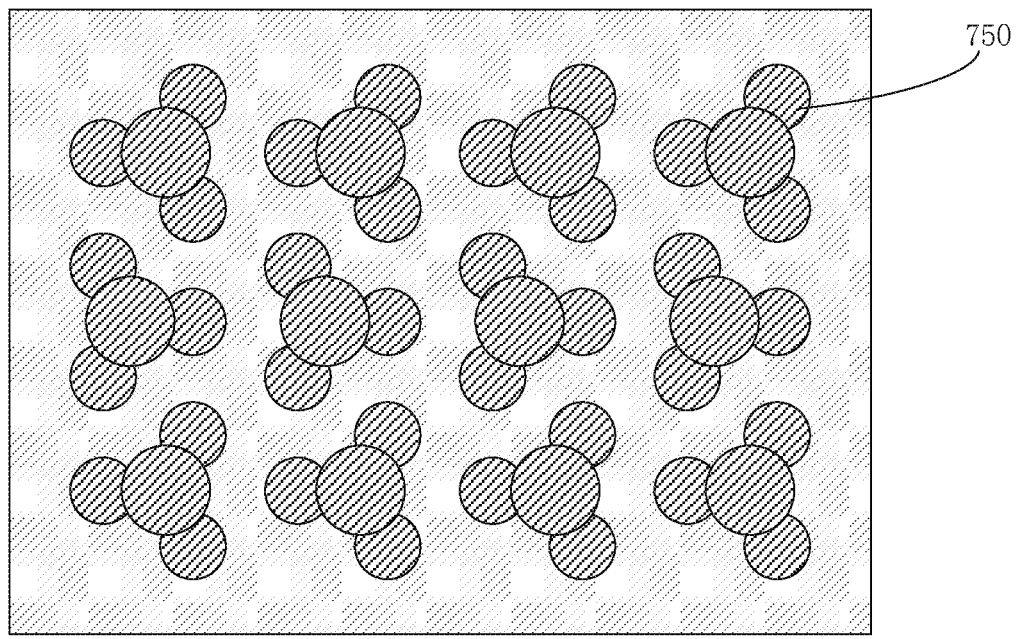
FIG. 19 is a schematic top view of a memory array region of a semiconductor device of FIG. 18.

In particular, FIG. 18 is a schematic cross-sectional view of a semiconductor device after S430, and FIG. 19 is a schematic top view of a memory array region 100A of a semiconductor device of FIG. 18. After S430, the capacitor opening holes are formed in the memory array region 100A. Referring to FIG. 19, in the embodiment, each capacitor opening hole is configured to open three capacitor holes of the columnar structure, and the capacitor opening holes expose a part of the substrate. In other embodiments, each capacitor opening hole may also be configured to open four or more capacitor holes.

Referring to FIG. 18, all of the first interlayer insulation layer 741, all of the second interlayer insulation layer 742, and a part of the supporting layer 750 in the memory array region 100A may be removed through the capacitor opening hole, thereby depositing a capacitor dielectric layer 220 and a second electrode layer 230 in a subsequent step, to form a double-sided columnar capacitor and increase a capacitance value of the columnar capacitor. The remaining supporting layer 750 is laterally connected to outer walls of the plurality of columnar structures of the first electrode layer 210, to support the first electrode layer 210. In particular, the supporting layer 750 on the top is located at the top periphery of the plurality of columnar structures of the first electrode layer 210, and the supporting layer 750 in the middle is located at the middle part of the plurality of columnar structures of the first electrode layer 210, to effectively support the first electrode layer 210.

S440: the capacitor dielectric layer 220 is formed on an inner surface and an outer surface of the first electrode layer 210.

S450: the second electrode layer 230 is formed on the surface of the capacitor dielectric layer 220.

In particular, the capacitor dielectric layer 220 covers the inner surfaces and the outer surfaces of the columnar structures of the first electrode layer 210 to fully utilize the inner surface and the outer surface of the first electrode layer 210 to constitute a columnar capacitor having a larger electrode surface area. Further, the material of the capacitor dielectric layer 220 may be a high-K dielectric material such as metal oxide. Further, the capacitor dielectric layer 220 may be a laminated structure, such as a dual structure of hafnium oxide-zirconium oxide. The second electrode layer 230 together with the capacitor dielectric layer 220 and the first electrode layer 210 may form a columnar capacitor both inside a columnar structure of the corresponding first electrode layer 210 and outside a corresponding columnar structure of the first electrode layer 210.

Further, the capacitor dielectric layer 220 may be formed on the inner surface and outer surface of the first electrode layer 210 and the exposed surface of each supporting layer 750 by using a chemical vapor deposition process or an atomic layer deposition process. The second electrode layer 230 is formed on the inner surface and the outer surface of the capacitor dielectric layer 220. In the embodiment, the capacitor dielectric layer 220 and the second electrode layer 230 may also extend sequentially to cover the surface of the supporting layer 750 reserved in the peripheral region 100B.

In an embodiment, the method for forming a semiconductor device may further include S600.

S600: an electrode filling layer 600 is formed on the surface of the second electrode layer 230. The electrode filling layer 600 fills up a gap formed by the second electrode layer 230.

In particular, referring to FIG. 1, FIG. 1 is a schematic cross-sectional view of a semiconductor device after S600. The electrode filling layer 600 may be formed on the surface of the second electrode layer 230 by using the chemical vapor deposition process, so that the electrode filling layer 600 fills gaps between the second electrode layers 230. Further, the material of the electrode filling layer 600 may be un-doped or boron-doped polysilicon.

In an embodiment, the method for forming a semiconductor device may further include S700.

S700: the second contact structure 730 is formed on the second electrode layer 230, and a third contact structure 800 is formed on the contact structure 700. The second contact structure 730 and the third contact structure 800 are simultaneously formed.

Figure 20:
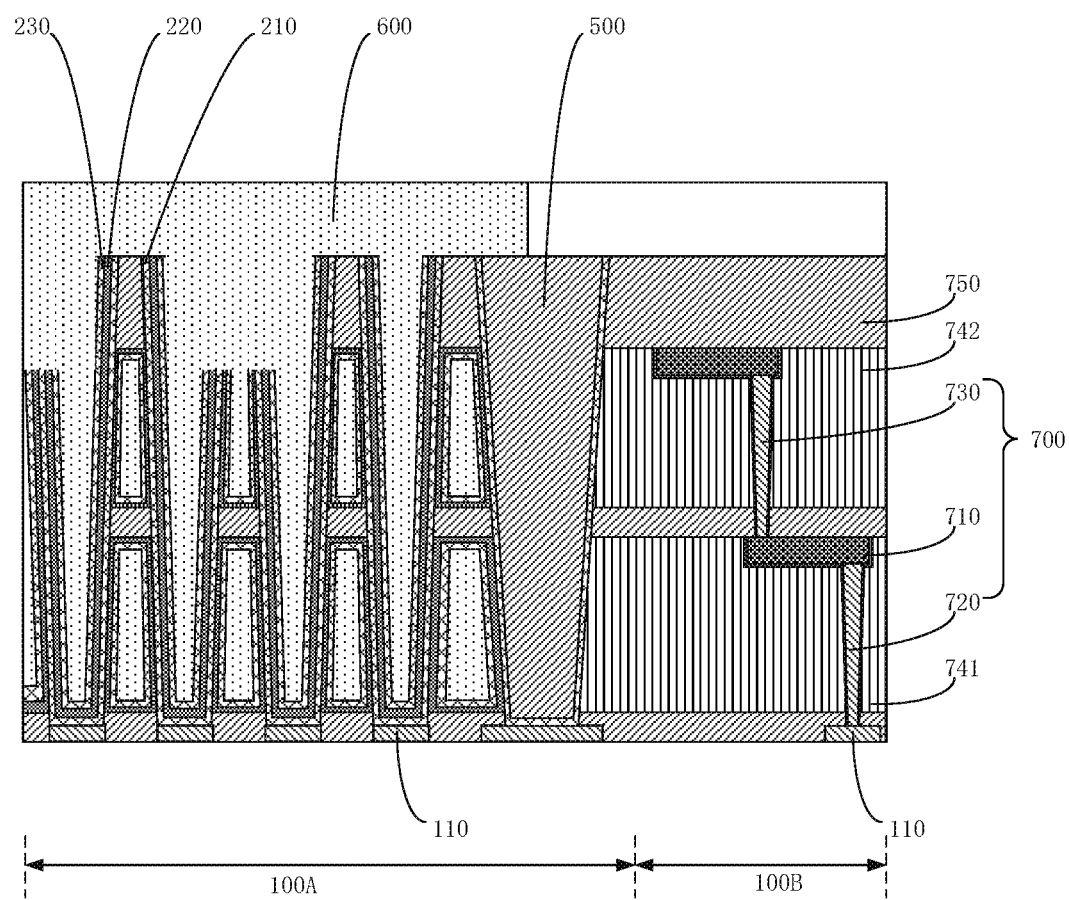
FIG. 20 is a schematic cross-sectional view of a semiconductor device after step S610.

In particular, before the third contact structure 800 is formed, S610 may be further included. S610: the electrode filling layer 600 in the peripheral region 100B is removed. FIG. 20 is a schematic cross-sectional view of a semiconductor device after S610. Further, with continued reference to FIG. 3, FIG. 3 is a schematic cross-sectional view of a semiconductor device after S700. A third interlayer insulation layer 760 may be formed on the top of the electrode filling layer 600, the peripheral structure 500 and the supporting layer 750 first, and a patterned fifth mask layer may be formed on the surface of the third interlayer insulation layer 760. A plurality of openings are formed in the fifth mask layer. The openings expose a part of the third interlayer insulation layer 760. Part of the openings partially overlaps the intermediate metal layer 710 at the top along the vertical direction, and the other openings partially overlap the electrode filling layer 600 along the vertical direction. And then, the first interlayer insulation layer 741 and the second interlayer insulation layer 742 are etched through the patterned fifth mask layer to form contact trenches. And then each contact trench may be filled with a metal conductive material by using an electroplating or sputtering process, and the redundant metal conductive material is further removed by a chemical mechanical planarization process, thereby forming a fourth contact structure 900 and the third contact structure 800.

It will be appreciated that although various steps in the flow charts of FIG. 4 and FIG. 5 are shown sequentially as indicated by the arrows, these steps are not necessarily performed sequentially as indicated by the arrows. Unless explicitly stated otherwise herein, the steps are not performed in a strict order, and the steps may be performed in other orders. Moreover, at least part of the steps of FIG. 4 and FIG. 5 may include a plurality of sub-steps or phases that are not necessarily performed at the same time, but may be performed at different times. The sub-steps or phases are not necessarily performed sequentially, but may be performed in turn or alternately with at least part of the other steps or the sub-steps or phases of the other steps.

The various technical features of the above embodiments may be combined in any combination, and in order to simplify the description, all possible combinations of the various technical features of the above embodiments are not described, however, as long as the combinations of these technical features are not contradictory, they should be considered to be within the scope of the specification.

The above embodiments are merely illustrative of several embodiments of the disclosure, which are described in more detail and are not to be construed as limiting the scope of the patent of the disclosure. It is to be noted that several variations and modifications may be made by those skilled in the art without departing from the spirit of the disclosure, which all fall within the scope of protection of the disclosure. Therefore, the scope of protection of the patent of the disclosure shall be determined by the appended claims.

What is claimed is:

1. A semiconductor device, comprising:
   a substrate comprising a memory array region and a peripheral region;
   a first interlayer insulation layer and a second interlayer insulation layer, formed in the memory array region and the peripheral region of the substrate, the first interlayer insulation layer and the second interlayer insulation layer being arranged at intervals along a direction perpendicular to the substrate;
   a columnar capacitor array, comprising columnar capacitors arranged at intervals, and the columnar capacitors being formed in the first interlayer insulation layer and the second interlayer insulation layer within the memory array region; and
   a contact structure, formed in the first interlayer insulation layer and the second interlayer insulation layer within the peripheral region,
   wherein the contact structure comprises a first contact structure and a second contact structure which are interconnected, the first contact structure or the second contact structure being interconnected by penetrating the first interlayer insulation layer or the second interlayer insulation layer, wherein an intermediate metal layer is further formed on a side of the first interlayer insulation layer away from the substrate, wherein a surface of the intermediate metal layer is flush with a surface of the first interlayer insulation layer, the first contact structure, the intermediate metal layer, the second contact structure being sequentially arranged in the direction perpendicular to the substrate, wherein the first contact structure and the second contact structure are interconnected through an intermediate metal layer, the first contact structure penetrating the first interlayer insulation layer for an upward connection to the intermediate metal layer, and the second contact structure penetrating the second interlayer insulation layer for a downward connection to the same intermediate metal layer.

2. The semiconductor device of claim 1, wherein the first contact structure and the second contact structure are interconnected vertically or interconnected in a staggered manner.

3. The semiconductor device of claim 1, wherein a supporting layer is formed on at least one of a surface of the first interlayer insulation layer, or a surface of the second interlayer insulation layer, the supporting layer extending in a direction parallel to the direction of the surface of the substrate to provide support for the first interlayer insulation layer and the second interlayer insulation layer, wherein thicknesses of the first interlayer insulation layer and the second interlayer insulation layer define a height of the subsequently-formed supporting layer.

4. The semiconductor device of claim 3, further comprising another intermediate metal layer, wherein the first contact structure, the intermediate metal layer, the second contact structure and said another intermediate metal layer are sequentially arranged in the direction perpendicular to the substrate, and the second contact structure penetrates the second interlayer insulation layer and the supporting layer for a downward connection to the same intermediate metal layer, an interconnection of the first contact structure and the second contact structure being formed.

5. The semiconductor device of claim 1, further comprising a peripheral structure which is located around an edge of the columnar capacitor array, the peripheral structure being formed in the first interlayer insulation layer and the second interlayer insulation layer.

6. The semiconductor device of claim 1, wherein the peripheral structure is a circumferentially closed or discontinuous structure.

7. The semiconductor device of claim 1, further comprising at least one interlayer insulation layer in addition to the first interlayer insulation layer and the second interlayer insulation layer, wherein a supporting layer is formed between two adjacent interlayer insulation layers to fit the columnar capacitors.

8. The semiconductor device of claim 1, wherein the columnar capacitor array includes a first electrode layer, a capacitor dielectric layer, and a second electrode layer, wherein the first electrode layer, the capacitor dielectric layer, and the second electrode layer are arranged in the memory array region;

wherein the first electrode layer comprising a plurality of columnar structures arranged in an array, wherein the supporting layer is connected to outer walls of the plurality of columnar structures of the first electrode layer to maintain stability of the structure of the first electrode layer;

wherein the capacitor dielectric layer covers an inner surface and an outer surface of the first electrode layer; and wherein the second electrode layer covers the surface of the capacitor dielectric layer.

9. The semiconductor device of claim 8, further comprising:

an electrode filling layer, covering the surface of the second electrode layer and filling up a gap formed by the second electrode layer.

10. The semiconductor device of claim 8, wherein a plurality of contact nodes are formed in the substrate, wherein bottoms of the plurality of columnar structures of the first electrode layer are connected in one-to-one correspondence with contact nodes in the memory array region, and the first contact structure is connected with a contact node in the peripheral region.

11. The semiconductor device of claim 10, further comprising a third contact structure and a fourth contact structure, wherein the bottom of the third contact structure is connected with the second electrode layer, the bottom of the fourth contact structure is connected with the contact structure, wherein the top of the fourth contact structure is flush with the top of the third contact structure; the fourth contact structure is electrically connected to the columnar capacitors through the second electrode layer, the third contact structure is electrically connected to the contact node in the peripheral region through the contact structure.

12. A method for forming a semiconductor device, comprising:

providing a substrate, the substrate comprising a memory array region and a peripheral region;

forming a first interlayer insulation layer and a second interlayer insulation layer on the substrate, wherein the first interlayer insulation layer and the second interlayer insulation layer are arranged at intervals along a direction perpendicular to the substrate;

forming a contact structure in the first interlayer insulation layer and the second interlayer insulation layer in the peripheral region; and forming a columnar capacitor array in the first interlayer insulation layer and the second interlayer insulation layer in the memory array region, wherein the columnar capacitor array comprises columnar capacitors arranged at intervals; and forming a supporting layer on a surface of the first interlayer insulation layer and a surface of the second interlayer insulation layer, or forming a supporting layer on the surface of the first interlayer insulation layer or on the surface of the second interlayer insulation layer, wherein a plurality of contact nodes are formed in both the memory array region and the peripheral region of the substrate, wherein the contact nodes in the memory array region are arranged in an array.

13. The method of claim 12, wherein the forming a contact structure in the first interlayer insulation layer and the second interlayer insulation layer in the peripheral region comprises:

forming, in the first interlayer insulation layer and the second interlayer insulation layer in the peripheral region, a first contact structure and a second contact structure that are interconnected, wherein the first contact structure or the second contact structure is interconnected by penetrating the first interlayer insulation layer or the second interlayer insulation layer.

14. The method of claim 13, wherein the forming, in the first interlayer insulation layer and the second interlayer insulation layer in the peripheral region, a first contact structure and a second contact structure that are interconnected comprises:

forming, in the first interlayer insulation layer and the second interlayer insulation layer in the peripheral region, a first contact structure and a second contact structure that are vertically interconnected or interconnected in a staggered manner.

15. The method of claim 12, further comprising:

forming a peripheral structure in the first interlayer insulation layer and the second interlayer insulation layer, wherein the peripheral structure is located around an edge of the columnar capacitor array.

16. The method of claim 15, wherein the forming a peripheral structure in the first interlayer insulation layer and the second interlayer insulation layer comprises:

forming a circumferentially closed or discontinuous peripheral structure in the first interlayer insulation layer and the second interlayer insulation layer.

17. The method of claim 12, wherein the forming a first interlayer insulation layer and a second interlayer insulation layer on the substrate, and the forming a contact structure in the first interlayer insulation layer and the second interlayer insulation layer in the peripheral region comprises:

forming a patterned first mask layer on the surface of the first interlayer insulation layer, to form a first contact structure trench;

etching the first interlayer insulation layer through the patterned first mask layer until the surface of the contact node, and removing the remaining first mask layer;

forming a contact metal layer in the first contact structure trench and on the surface of the first interlayer insulation layer, removing the contact metal layer on the surface of the first interlayer insulation layer, wherein the remaining contact metal layer serves as the first contact structure;

forming a patterned second mask layer on the surface of the first interlayer insulation layer, wherein the size of an opening in the second mask layer along a horizontal plane is greater than the size of the contact node and the size of the first contact structure;

etching the first interlayer insulation layer and the first contact structure through the patterned second mask layer until a set depth, and removing the remaining second mask layer;

filling a trench of the first interlayer insulation layer with an intermediate metal layer, and forming the supporting layer and the second interlayer insulation layer on the surface of the first interlayer insulation layer; and repeating the foregoing steps to form the second contact structure and another intermediate metal layer in the peripheral region.

* * * * *